United States Patent
Lee et al.

(10) Patent No.: US 7,180,064 B2
(45) Date of Patent: Feb. 20, 2007

(54) INFRARED SENSOR PACKAGE

(75) Inventors: Han-Sheng Lee, Bloomfield Hills, MI (US); Dan W. Chilcott, Greentown, IN (US); James H. Logsdon, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 233 days.

(21) Appl. No.: 10/710,260

(22) Filed: Jun. 29, 2004

(65) Prior Publication Data

US 2005/0017175 A1    Jan. 27, 2005

Related U.S. Application Data

(60) Provisional application No. 60/489,726, filed on Jul. 24, 2003.

(51) Int. Cl.
    *G01J 5/00*    (2006.01)
(52) U.S. Cl. ............... 250/338.1; 250/338.4; 257/434; 257/448; 257/687
(58) Field of Classification Search ......... 250/338.1, 250/338.4, 336.1, 332, 370.08; 257/434, 257/448, 687, 257
    See application file for complete search history.

(56) References Cited

U.S. PATENT DOCUMENTS

| | | | |
|---|---|---|---|
| 5,369,280 A * | 11/1994 | Liddiard | 250/370.08 |
| 5,374,123 A * | 12/1994 | Bu | 374/109 |
| 5,479,018 A * | 12/1995 | McKee et al. | 250/338.1 |
| 5,689,087 A * | 11/1997 | Jack | 136/213 |
| 5,804,847 A * | 9/1998 | Robinson | 257/257 |
| 6,031,231 A * | 2/2000 | Kimata et al. | 250/332 |
| 6,163,061 A * | 12/2000 | Iida | 257/467 |
| 6,222,111 B1* | 4/2001 | Kern | 136/201 |
| 6,229,144 B1* | 5/2001 | Ouvrier-Buffet et al. | 250/338.4 |
| 6,238,085 B1* | 5/2001 | Higashi et al. | 374/10 |
| 6,316,770 B1* | 11/2001 | Ouvrier-Buffet et al. | 250/338.1 |
| 6,335,478 B1* | 1/2002 | Chou et al. | 136/201 |
| 6,384,473 B1 | 5/2002 | Peterson et al. | 257/680 |
| 6,603,183 B1* | 8/2003 | Hoffman | 257/434 |
| 6,627,518 B1* | 9/2003 | Inoue et al. | 438/458 |
| 6,686,653 B2 | 2/2004 | Jerominek et al. | 257/680 |
| 6,891,259 B2* | 5/2005 | Im et al. | 257/687 |
| 6,949,286 B2* | 9/2005 | Nakajima et al. | 428/331 |
| 7,022,990 B2* | 4/2006 | Ruiz | 250/338.1 |
| 7,038,288 B2* | 5/2006 | Lai et al. | 257/448 |
| 2002/0023765 A1 | 2/2002 | Sugiura et al. | 174/52.2 |
| 2004/0159902 A1* | 8/2004 | Li et al. | 257/432 |
| 2006/0118721 A1* | 6/2006 | Antoszewski et al. | 250/338.4 |

* cited by examiner

*Primary Examiner*—Otilia Gabor
*Assistant Examiner*—Faye Boosalis
(74) *Attorney, Agent, or Firm*—Jimmy L. Funke

(57) ABSTRACT

An optical sensor package with a substrate that supports a membrane carrying an optical sensor and through which radiation passes to impinge the sensor. The substrate has a first surface in which a cavity is defined, a second surface opposite the first surface, and a wall between the cavity and the second surface. The optical sensor is supported on the membrane, which is bonded to the substrate and spans the cavity in the substrate. A window is defined at the second surface of the substrate for enabling infrared radiation to pass through the wall of the substrate to the optical sensor.

20 Claims, 1 Drawing Sheet

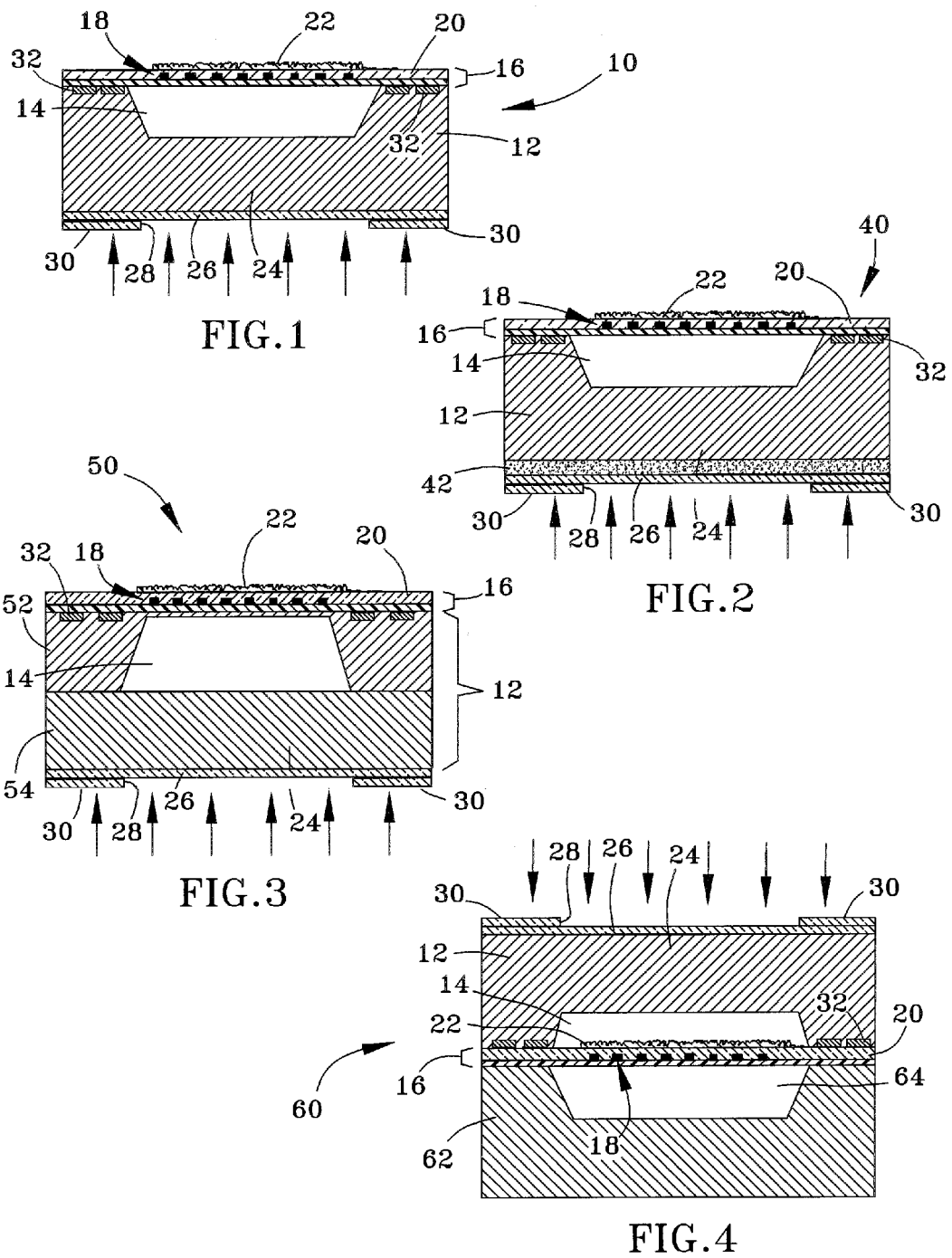

INFRARED SENSOR PACKAGE

CROSS REFERENCE TO RELATED APPLICATIONS

This application claims the benefit of the U.S. Provisional Application No. 60/489,726, filed Jul. 24, 2003.

BACKGROUND OF INVENTION

1. Field of the Invention

The present invention generally relates to packages for containing electronic devices, and more particularly to a package having a infrared sensor mounted to a silicon base through which infrared radiation passes before impinging the sensor.

2. Description of the Related Art

Infrared (IR) sensors have been used to measure the temperature of thermal sources, such as hot materials, humans, etc. To accurately detect heat radiated from a target, interference from ambient light, particularly visible light, should be filtered out. This can be done by adding a filter in front of the IR sensor. For example, in commonly-assigned U.S. Patent No. 6,844,606 to Logsdon et al., a chip formed of silicon—which allows only wavelengths longer than about 1.1 μm to pass through—is individually mounted to a chip carrier on which an infrared sensor is mounted so that the silicon chip is between the sensor and the target being sensed. In the automotive applications, an IR sensor package equipped with such a silicon "window" allows a targeted subject, such as the driver or passengers of a car, to be monitored with minimum background interferences.

SUMMARY OF INVENTION

The present invention is directed to an optical sensor package in which a substrate supports a membrane carrying an optical sensor, and radiation passes through the substrate to impinge the sensor.

Generally, the optical sensor package includes a substrate, at least a portion of which is formed of silicon. The substrate has a first surface in which a cavity is defined, a second surface opposite the first surface, and a wall between the cavity and the second surface. An optical sensing element is supported on a membrane bonded to the substrate and spanning the cavity in the substrate. A window is defined at the second surface of the substrate for enabling infrared radiation to pass through the wall of the substrate to the optical sensing element. The wall preferably has a bandgap of about 1.1 eV so as to absorb impinging radiation with wavelengths shorter than 1.1 micrometers, such that only radiation of wavelengths longer than 1.1 micrometers pass therethrough to the optical sensing element.

From the above, it can be seen that a significant advantage of the invention is that the filter required for the sensor to be active only in the desired optical range is an integral part of the sensor structure.

Other objects and advantages of this invention will be better appreciated from the following detailed description.

BRIEF DESCRIPTION OF DRAWINGS

FIG. 1 is a cross-sectional view of an infrared sensor package in accordance with a first embodiment of this invention.

FIGS. 2 and 3 show second and third embodiments of infrared sensor packages of this invention, wherein the backside of the silicon chip is provided with a filtering layer.

FIG. 4 shows a fourth embodiment of an infrared sensor package of this invention, wherein the sensing elements are enclosed for protection from the surrounding environment.

DETAILED DESCRIPTION

The present invention provides an optical sensor package that employs a silicon-containing substrate as the supporting material for an IR sensor, which is preferably made by standard integrated circuit (IC) fabrication processes. A preferred sensor employs a thermopile as the IR sensor, such as the thermopiles disclosed in commonly-assigned U.S. Pat. Nos. 6,793,389 and 6,828,172, the contents of which relating to thermopile construction are incorporated herein by reference. In addition, a suitable thermocouple structure for the thermopile is disclosed in commonly-assigned U.S. patent application publication No. 2005/0016576 to Jiang et al., the contents of which relating to thermocouple construction are incorporated herein by reference.

According to the present invention, the substrate is configured to define a wall that serves as a filter to filter out visible light, allowing only infrared wavelengths of interest to reach the IR sensor. According to a preferred aspect of the invention, integrated circuitry for performing logic functions and signal processing required for the IR sensor can also be fabricated on or in the substrate.

FIG. 1 is a cross-sectional view of an IR sensor package 10 in accordance with a first embodiment of the invention. The package 10 comprises a silicon substrate 12 in which a cavity 14 has been formed (e.g., etched), a multilayer membrane 16 bonded to the substrate 12 and enclosing the cavity 14, and a thermopile sensor 18 formed in a layer 20 of the membrane 16. Standard IC processes and micromachining techniques can be used to fabricate the sensor 18, including its structure and elements, on the membrane 16. One or more layers 22 of infrared absorbing and reflecting materials are shown as being formed on the membrane 16, thereby defining the outer surface of the membrane 16 to enhance infrared absorption and heat generation within the sensor 18. Suitable materials for the infrared absorbing and reflecting layers 22 include oxynitride, tetra-ethyl-orthosilicate (TEOS) based oxides, low-temperature deposited oxides, and aluminum.

The membrane 16 is bonded to the silicon substrate 12, which is preferably a monocrystallographic silicon chip. According to a preferred aspect of the invention, the package 10 is one of any number of packages that are micromachined and assembled at wafer-level and subsequently singulated into individual packages. Integrated circuitry 32 for performing logic functions and signal processing required for the thermopile sensor 18 is represented as being fabricated in the silicon substrate 12, such as located in the surface to which the membrane 16 is bonded. A wall 24 is defined by and between the cavity 14 and the backside surface of the substrate 12, and serves as a silicon window through which infrared radiation is permitted to pass to impinge the sensor 18 while filtering out undesired radiation. For this purpose, the backside surface of the substrate 12 has an antireflection coating 26, a portion of which is exposed within an opening 28 formed in an outer coating 30 to define the window region of the wall 24. The antireflection coating 26 minimizes the amount of infrared radiation reflected by the silicon substrate 12. Suitable materials for the antireflection coating 26 include a single layer of silicon nitride, organic layers, and other custom composite layers of appropriate materials at appropriate thicknesses to meet the required radiation spectrum sensing regime. The outer coating 30 on the substrate 12 is preferable opaque to the desired range of infrared radiation wavelengths, so that radiation of the desired wavelengths impinges the location on the membrane 16 corresponding to the location of the thermopile sensor 18, but radiation of other wavelengths are otherwise reflected to minimize thermal energy absorption by the sensor package 10.

In view of the package configuration shown in FIG. 1, use of the sensor package 10 involves facing the backside of the silicon substrate 12 toward the intended target, such as the driver or passengers of a vehicle, so that infrared radiation passes through the silicon wall 24 of the substrate 12 to the sensing elements of the sensor 18 on the membrane 16. In this manner, visible light with wavelengths shorter than about 1.1 µm is filtered out by the silicon wall 24 before reaching the sensor 18.

FIG. 2 shows an IR sensor package 40 similar to that of FIG. 1 (with the same reference numbers used to identify essentially the same features), but with a filter material 42 implanted and driven-in or epitaxially grown on the backside of the substrate 12 to provide a filtering layer. Depending on the filter material 42 different wavelengths of light can be filtered. Candidate materials include germanium (Ge), PbS, InAs, and PbTe, which allow only wavelengths longer than about 1.88, 3.02, 3.44 and 4.0 µm, respectively, to pass through the window 24 to the sensor 18.

FIG. 3 shows a package 50 that is a variation of FIG. 2, in which filtering is achieved with a filter chip 54 that has been bonded to a silicon chip 52 to form the substrate 12. The chip 52 is represented as having been etched from backside to frontside (opposite that of FIGS. 1 and 2), such that the cavity 14 extends completely through the chip 52. The filter chip 54 can be, for example, a silicon or germanium chip bonded to the silicon chip 52. In this embodiment, wafer-level packaging of the additional filter material, as opposed to chip-level packaging, has the ability of lowering manufacture costs.

FIG. 4 shows another variation of FIG. 2, in which a triple stack of wafers is used to form a package 60 that encloses the membrane 16, thereby protecting the membrane 16 and its thermopile sensor 18 from the surrounding environment. The package 60 is represented as having a third chip 62 bonded to the membrane 16, with a cavity 64 defined in the chip 62 so as to protectively enclose the membrane 16. Suitable materials for the chip 62 include silicon, the use of which permits the package 60 to be formed by silicon-to-silicon wafer bonding techniques.

While the invention has been described in terms of a preferred embodiment, it is apparent that other forms could be adopted by one skilled in the art. Accordingly, the scope of the invention is to be limited only by the following claims.

The invention claimed is:

1. An optical sensor package comprising:
    a substrate having a first surface in which a cavity is defined, a second surface opposite the first surface, and a wall between the cavity and the second surface, at least a portion of the substrate being formed of silicon;
    a membrane bonded to the substrate and spanning the cavity in the substrate;
    an optical sensing element on the membrane; and
    a window located at the second surface so that infrared radiation passes through the wall of the substrate, through the cavity, and then to the optical sensing element.

2. The optical sensor package according to claim 1, wherein the optical sensing element is a thermopile.

3. The optical sensor package according to claim 1, further comprising integrated circuitry on the substrate, the integrated circuitry performing logic functions and signal processing for the optical sensing element.

4. The optical sensor package according to claim 3, wherein the integrated circuitry is between the membrane and the substrate.

5. The optical sensor package according to claim 1, wherein the substrate and the wall are defined by a monocrystallographic silicon chip and the wall only allows radiation of wavelenaths longer than 1.1 micrometers to pass therethrough to the optical sensing element.

6. The optical sensor package according to claim 1, further comprising a filtering material at the second surface of the substrate.

7. The optical sensor package according to claim 6, wherein the filtering material is implanted in the second surface of the substrate.

8. The optical sensor package according to claim 6, wherein the filtering material is epitaxially grown on the second surface of the substrate.

9. The optical sensor package according to claim 6, wherein the filtering material is a first chip that constitutes a first portion of the substrate, the cavity is defined in a silicon chip that constitutes a second portion of the substrate, and the first and silicon chips are bonded together to form the substrate.

10. The optical sensor package according to claim 6, wherein the filtering material is chosen from the group consisting of germanium, PbS, InAs, and PbTe.

11. The optical sensor package according to claim 1, further comprising an antireflection coating on the second surface of the substrate, the antireflection coating minimizing reflection of infrared radiation by the substrate.

12. The optical sensor package according to claim 11, wherein the window comprises a coating on the antireflection coating, the coating being substantially opaque to infrared radiation and having an opening aligned with the wall of the substrate and the optical sensing element on the membrane.

13. The optical sensor package according to claim 1, further comprising a capping chip secured to the substrate and enclosing the membrane.

14. An infrared sensor package comprising:
    a substrate having a first surface in which a cavity is defined, a second surface opposite the first surface, and a wall defined by and between the cavity and the second surface, at least a portion of the substrate being formed of silicon;
    a membrane bonded to the substrate and spanning the cavity in the substrate;
    a thermopile sensing element on the membrane; and
    integrated circuitry on the substrate, the integrated circuitry performing logic functions and signal processing for the thermopile sensing element;
    a window located at the second surface so that infrared radiation passes through the wall of the substrate, through the cavity, and then to the thermopile sensing element.

15. The infrared sensor package according to claim 14, wherein the wall is defined by the silicon portion of the substrate.

16. The infrared sensor package according to claim 14, wherein the substrate and the wall are defined by a monocrystallographic silicon chip.

17. The infrared sensor package according to claim 14, further comprising a filtering material implanted in the second surface of the substrate.

18. The infrared sensor package according to claim 14, further comprising a filtering material epitaxially grown on the second surface of the substrate.

19. The infrared sensor package according to claim 14, wherein the substrate comprises a first chip of a filtering material bonded to a silicon chip in which the cavity is defined.

20. The infrared sensor package according to claim 14, further comprising a capping chip secured to the substrate and defining a cavity that encloses the membrane.

* * * * *